US007250857B2

United States Patent
Maier (10) Patent No.: US 7,250,857 B2
(45) Date of Patent: Jul. 31, 2007

(54) MULTIPLEXER METHOD AND SYSTEM FOR INTRINSICALLY SAFE APPLICATIONS AND A MULTIPLEXER SWITCH FOR USE THEREIN

(75) Inventor: Lawrence Carl Maier, New Haven, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 730 days.

(21) Appl. No.: 10/743,419

(22) Filed: Dec. 22, 2003

(65) Prior Publication Data

US 2005/0043928 A1 Feb. 24, 2005

Related U.S. Application Data

(60) Provisional application No. 60/493,262, filed on Aug. 7, 2003.

(51) Int. Cl.
*G08B 19/00* (2006.01)
*G05B 11/01* (2006.01)

(52) U.S. Cl. .............. 340/521; 340/855.3; 340/870.12; 340/870.13; 340/612; 340/618; 340/500; 340/506; 340/505; 340/853.2; 340/14.63; 700/11; 324/769

(58) Field of Classification Search ................ 340/521, 340/855.3, 870.12, 870.13, 612, 618, 14.63, 340/853.2
See application file for complete search history.

(56) References Cited

U.S. PATENT DOCUMENTS

| 3,524,996 | A | * | 8/1970 | Mielke et al. ............... 327/389 |
| RE31,089 | E | * | 11/1982 | Adamson ............... 340/870.19 |
| 4,497,033 | A | * | 1/1985 | Hernandez et al. ........... 702/55 |
| 4,831,360 | A | * | 5/1989 | Clarkson et al. ............ 340/521 |
| 5,870,695 | A | * | 2/1999 | Brown et al. ............... 702/138 |

* cited by examiner

*Primary Examiner*—Donnie L. Crosland
(74) *Attorney, Agent, or Firm*—Calfee, Halter & Griswold LLP (57) ABSTRACT

A multiplexing system is provided for a plurality of sensors disposed in a tank containing a potentially explosive environment and excited from a common excitation circuit outside of the tank through a corresponding plurality of signal lines that penetrate the tank. The multiplexing system comprises: a multiplexer switch for each sensor, each multiplexer switch disposed outside of the tank in series with the corresponding signal line between the common excitation circuit and the corresponding sensor in the tank. Each multiplexer switch comprises: at least one field effect transistor having a current channel connected in series with the corresponding signal line; an isolation circuit; and a drive circuit coupled to the at least one field effect transistor through the isolation circuit for operating the current channel thereof, the isolation circuit electrically isolating the drive circuit from the at least one field effect transistor to limit energy coupled to the corresponding signal line through the at least one field effect transistor to below levels that could initiate an ignition of the potentially explosive environment of the tank. A multiplexing method is also disclosed.

33 Claims, 7 Drawing Sheets

MULTIPLEXER METHOD AND SYSTEM FOR INTRINSICALLY SAFE APPLICATIONS AND A MULTIPLEXER SWITCH FOR USE THEREIN

This application claims the benefit of the filing date Aug. 7, 2003 of the U.S. Provisional Patent Application No. 60/493,262.

BACKGROUND OF THE INVENTION

The present invention relates to intrinsically safe circuits and systems, in general, and more particularly to a multiplexing method and system for a plurality of sensors disposed in a tank containing a potentially explosive environment, and a multiplexer switch for use therein.

In systems which supply signals to and receive signals from a contained environment comprising combustible or explosive vapors, restrictions are imposed to limit the energy over the signal lines penetrating the container below levels that could initiate an ignition of such vapors. For example, in a fuel quantity measurement system, sensors are disposed within a fuel tank and when excited, provide response signals indicative of the fuel level in the tank. Accordingly, each sensor has an excitation signal line and response signal line that penetrate the fuel tank. In order to be intrinsically safe, the circuitry that provides the excitation signals and receives the response signals are specially designed to limit the energy over the signal lines penetrating the tank to within safe levels under normal operating and failure conditions.

Having dedicated intrinsically safe excitation and signal conditioning circuits for each sensor of the contained environment is very expensive and complex. Accordingly, system designers have proposed a multiplexing system in which a group of sensors may be excited from a common excitation circuit and the resulting response signals from the sensors received by a common signal conditioning circuit. Thus, the costs and complexity can be reduced by a factor dependent upon the number of sensors in the multiplexed group. Multiplexing systems conventionally include controlled switches in series with the signal lines.

These multiplexer switches pose certain conditions to the designer of an intrinsically safe system which must be considered. For example, any switch added to the system needs to preserve the intrinsically safe nature of the common excitation and signal conditioning circuits and associated signal lines. However, to operate conventional multiplexer switches, a voltage is generally applied directly to the switch from a power source. Thus, if a failure occurs within the switch, this drive voltage may become directly connected to the corresponding signal line, resulting in a defeat of the intrinsically safe design. Moreover, it would be beneficial to render this preservation of intrinsic safety by maintaining the circuitry of each multiplexer switch to a minimum.

Another consideration results from the line capacitance of the signal lines from the excitation circuit to the sensors and from the sensors to the signal conditioning circuit. This line capacitance acts as a load to ground via a cover shield, for example, and may draw a significant amount of current from the excitation signal. For example, at ten volts AC with a frequency of around eighteen thousand hertz, as much as eleven or twelve milliamps may be drawn through the line capacitance. Conventional multiplexer switches have significant "on" resistance such that the current drawn by the signal line capacitance cause an undesirable voltage drop across the switch, resulting in a measurement error which may be in the range of five percent or so.

Further, reactive loading of the excitation signal can often cause an amplifier driving the signal to become unstable. To enhance stability, circuitry is generally added to the amplifier design. However, the addition of significant switch resistance in series with the excitation signal may interfere with the sensitive stability design of the drive amplifier.

Yet another consideration results from the stray capacitance in the signal line from the sensor back to the signal conditioning circuit. As noted above, a conventional multiplexer switch adds significant in series "on" resistance to the response signal. The current of the response signal which flows through this switch "on" resistance results in a voltage drop across the stray line capacitance, that, in turn, diverts some of the sensor response current to ground through the line capacitance. This undesirable diversion of current may also result in a measurement error.

The present invention ensures preservation of an intrinsically safe design and overcomes the drawbacks of conventional multiplexer switches especially in regard to circuit stability, line capacitance and measurement error noted above.

SUMMARY OF THE INVENTION

In accordance with one aspect of the present invention, a multiplexer switch comprises: at least one field effect transistor having a current channel connected in series with a signal line that penetrates a tank containing a potentially explosive environment; an isolation circuit; and a drive circuit coupled to the at least one field effect transistor through the isolation circuit for operating the current channel thereof, the isolation circuit electrically isolating the drive circuit from the at least one field effect transistor to limit energy coupled to the signal line through the at least one field effect transistor to below levels that could initiate an ignition of the potentially explosive environment of the tank.

In accordance with another aspect of the present invention, a multiplexing system is provided for a plurality of sensors disposed in a tank containing a potentially explosive environment and excited from a common excitation circuit outside of the tank through a corresponding plurality of signal lines that penetrate the tank. The multiplexing system comprises: a multiplexer switch for each sensor, each multiplexer switch disposed outside of the tank in series with the corresponding signal line between the common excitation circuit and the corresponding sensor in the tank. Each multiplexer switch comprises: at least one field effect transistor having a current channel connected in series with the corresponding signal line; an isolation circuit; and a drive circuit coupled to the at least one field effect transistor through the isolation circuit for operating the current channel thereof, the isolation circuit electrically isolating the drive circuit from the at least one field effect transistor to limit energy coupled to the corresponding signal line through the at least one field effect transistor to below levels that could initiate an ignition of the potentially explosive environment of the tank.

In accordance with yet another aspect of the present invention, a method of multiplexing an excitation signal from a common excitation circuit to a plurality of sensors disposed in a tank containing a potentially explosive environment comprises the steps of: disposing a multiplexer switch is series with each signal line coupling a corresponding sensor of the plurality to the common excitation circuit outside of the tank; isolating each multiplexer switch from a corresponding drive circuit to limit energy coupled to the corresponding signal line through the corresponding multiplexer switch to below levels that could initiate an ignition of the potentially explosive environment; and controlling the drive circuits to multiplex the excitation signal from the excitation circuit to selected sensors of the plurality through the corresponding multiplexer switches.

DETAILED DESCRIPTION OF THE INVENTION

One aspect of the present invention is directed to a multiplexing system and a multiplexer switch for use therein that permits a plurality of sensors to be successively excited and read by a single electronics channel or the entire plurality excited and read by two or more electronic channels. The multiplexer switching function of the present invention can be performed directly in the signal lines of sensor leads even with impedance sensitive sensor signaling, and with circuits that have been stabilized for reactive loads without upsetting the circuit stability. In addition, it can be applied to circuits where it is critical that the sensor signal exactly match a reference signal. More particularly, all of the switching functions of the multiplexer system can be accomplished in circuits or signal lines that have been designed for intrinsically safe applications without compromising the intrinsically safe nature of the circuitry or signal lines.

Figure 1:
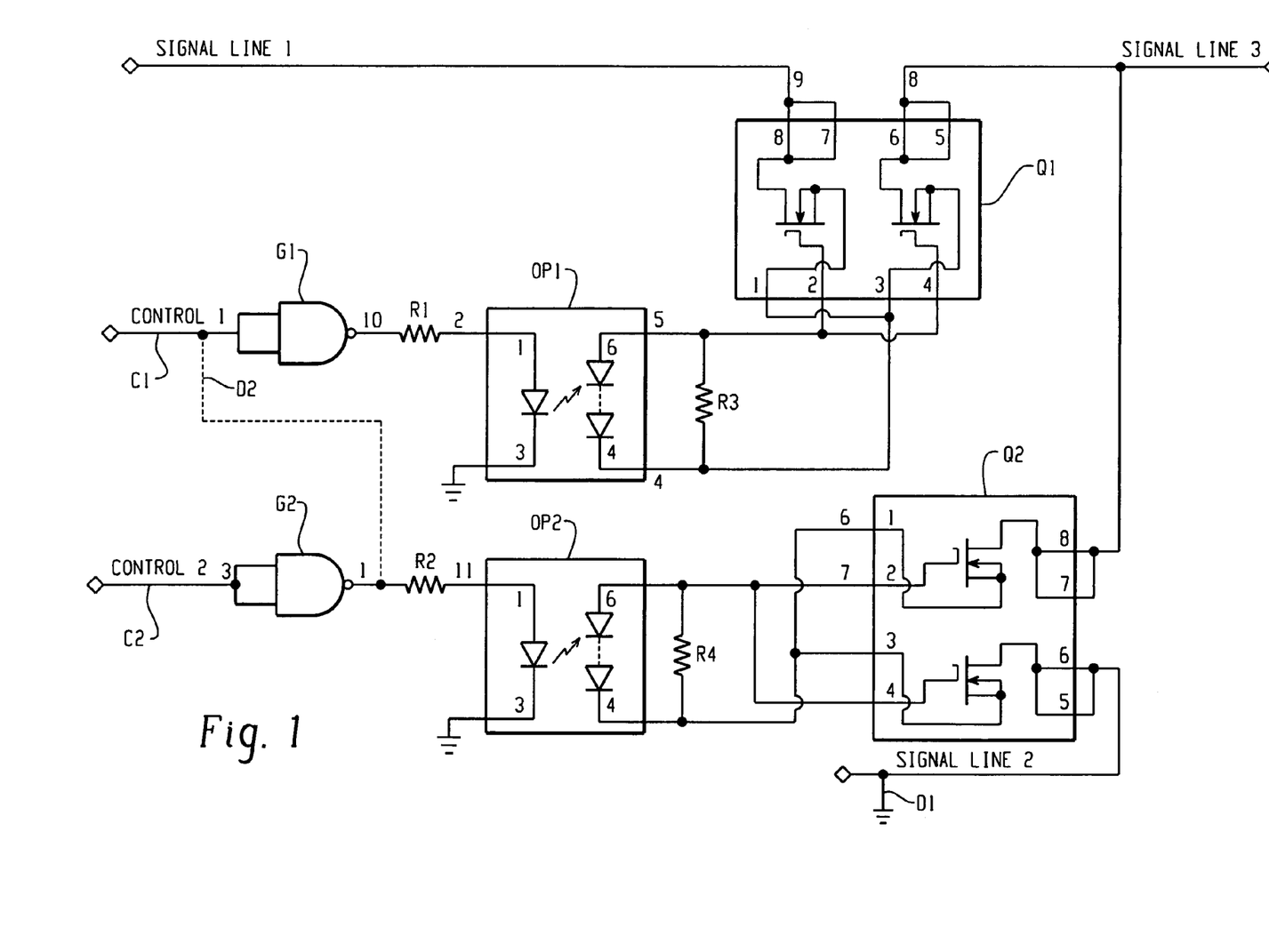
FIG. 1 is a circuit schematic of an exemplary multiplexer switch suitable for embodying an aspect of the present invention.

FIG. 1 is a circuit schematic of an exemplary multiplexer switch suitable for embodying an aspect of the present invention. As shown in FIG. 1, the multiplexer switch embodiment is configured as a single pole double throw switch in which one of signal lines 1 and 2 may be selected for connecting to signal line 3 by switches denoted as Q1 and Q2. In the present embodiment, each switch Q1 and Q2 comprises two N channel metal oxide semiconductor field effect transistors (MOSFETs) connected in series source to source to form a bi-directional switch that will operate with both AC and DC signals. Switches Q1 and Q2 may be an integrated circuit of the type marketed under a part number IRF7341, for example. More specifically, the drain of one of the MOSFETs of each switch Q1 and Q2 is connected commonly to signal line 3. In addition, the drain of the other MOSFET of Q1 is connected to signal line 1 and the drain of the other MOSFET of Q2 is connected to signal line 2. Each MOSFET may have an in series "on" resistance of 0.043 ohms and a maximum isolation voltage (the maximum voltage that can be turned off reliably) of 55 volts, for example. Other FETs may be selected with "on" resistance and isolation voltage specifications as the application dictates.

The switch embodiment of FIG. 1 includes optical isolators OP1 and OP2 which may be voltage output isolators of the type marketed under the part number TLP190B, for example. Internally in each isolator OP1 and OP2, light output from a light emitting diode is focused on an array of series connected photocells which may be photodiodes. The photocells convert the light to an output voltage across the series connection thereof. There is electrical isolation on the order of 2500 volts, for example, between the light emitting diode circuit and the photocell circuit in each of the isolators OP1 and OP2. In the present embodiment, application of a current through the input light emitting diode results in an output voltage of approximately 10V that is electrically isolated from the input of the optical isolator. Resistors R3 and R4 may be coupled in parallel with the array of photocells of OP1 and OP2, respectively. In the present embodiment, each resistor R3 and R4 may be on the order of 300K ohms, for example.

The voltage output of OP1 is connected across the gate to source junctions of both of the MOSFETS of the switch Q1 and the voltage output of OP2 is connected across the gate to source junctions of both of the MOSFETS of the switch Q2. The light emitting diode of OP1 is driven by a control signal C1 through a NAND gate G1 and resistor R1 and the light emitting diode of OP2 is driven by a control signal C2 through a NAND gate G2 and resistor R2. Resistors R1 and R2 may be on the order of 200 ohms, for example.

In the present embodiment, when the gate to source voltage of the series connected MOSFETs is zero, i.e. no voltage output from an optical isolator, both MOSFETs will be non-conducting and have a high series resistance, thus blocking the connection of the signal lines connected thereto. If the gate to source voltage of the series connected MOSFETs is more than 5V from the voltage output of an isolator, then both FETs will be rendered conducting or turned "on". Under these conditions, each MOSFET will afford a low series resistance path from the drain of one FET to the drain of the other (i.e. a low "on" resistance contact), thus connecting the signal lines connected thereto. In this manner, Q1 and Q2 may be controlled by providing either 0V or more than 5V from the common source point to the common gate point of the series connected MOSFETs thereof.

Control of the switch embodiment of FIG. 1 is provided by control signals C1 and C2. In the present embodiment, when the control signal C1 is low, the output of gate G1 is high, (drive state) resulting in current flow through the input diode of OP1. This has the effect of applying a voltage greater than 5 volts across the gate to source of the MOSFETs of Q1 via OP1 which renders Q1 conducting to connect signal line 1 to signal line 3. At the same time, the control signal 2 is maintained high which results in a low output on gate G2, resulting in no current flow through the input diode of OP2. Under these conditions, Q2 is therefore rendered non-conducting or "off", and signal line 2 is isolated from signal line 3.

Setting the control signal 2 to low (true) and signal line 1 to high (false), reverses all of the logic states. In this state, current flows through the input diode of OP2 and no current flows through the input diode of OP1. Thus, Q2 is turned "on" and Q1 is turned "off" and signal line 2 is connected to signal line 3 and signal line 1 is isolated from signal line 3. Note that the "on" resistance of Q1 and Q2 when conducting is approximately 0.086 ohms for the present embodiment. This value of in series "on" resistance will have an insignificant effect on the signal input source impedance, and will thus have a negligible effect on the signal itself. Other FETs may be selected if a lower "on" resistance is desired.

Combining the voltage output of the optical isolator with the voltage control properties of the MOSFETs results in a switch embodiment that can be turned on and off in response to a current through the input light emitting diode of the optical isolator. Further, since there is no contact between the isolator input diode circuit and output voltage circuit, the MOSFETs are completely isolated from the switch control logic circuitry. The voltage output of the optical isolator has a current capability of less than 50 uA. Thus, even a failure of the MOSFET gate circuitry cannot cause a significant amount of energy to flow in the signal line or circuit as a result of activity in the control circuitry. Since there are no other power sources required in the switch embodiment, the addition of the multiplexer switch in series with the signal line will not affect the intrinsic safety capability of the signal circuitry.

The multiplexer switch embodiment of FIG. 1 may be configured to turn an excitation signal on and off to a selected sensor. For example, the excitation signal may be coupled over signal line 1, signal line 2 may be coupled to ground as shown by the dashed line D1, and signal line 3 may be coupled to the sensor. In addition, the output of gate G2 may be coupled to the inputs of gate G1 as shown by the dashed line D2. In this configuration, control C2 governs the operation of the switch embodiment. When control signal C2 is high, the output of G2 is low and no light is coupled across the barrier in OP2. In addition, with C2 high, the output of G1 is high (double inversion by G2 and G1) and light is coupled across the barrier of OP1. In this state, the excitation signal is connected to the sensor via Q1 in conduction, and signal line 3 is isolated from ground by Q2 which is open circuited. When control signal C2 is low, the output of G2 is high and light is coupled across the barrier in OP2. In addition, with C2 low, the output of G1 is low and no light is coupled across the barrier of OP1. In this state, the excitation signal is isolated from signal line 3 by Q1 which is off or open circuited, and signal line 3 is held at ground by Q2 in conduction to prevent static build up or stray signal paths.

Figure 2:
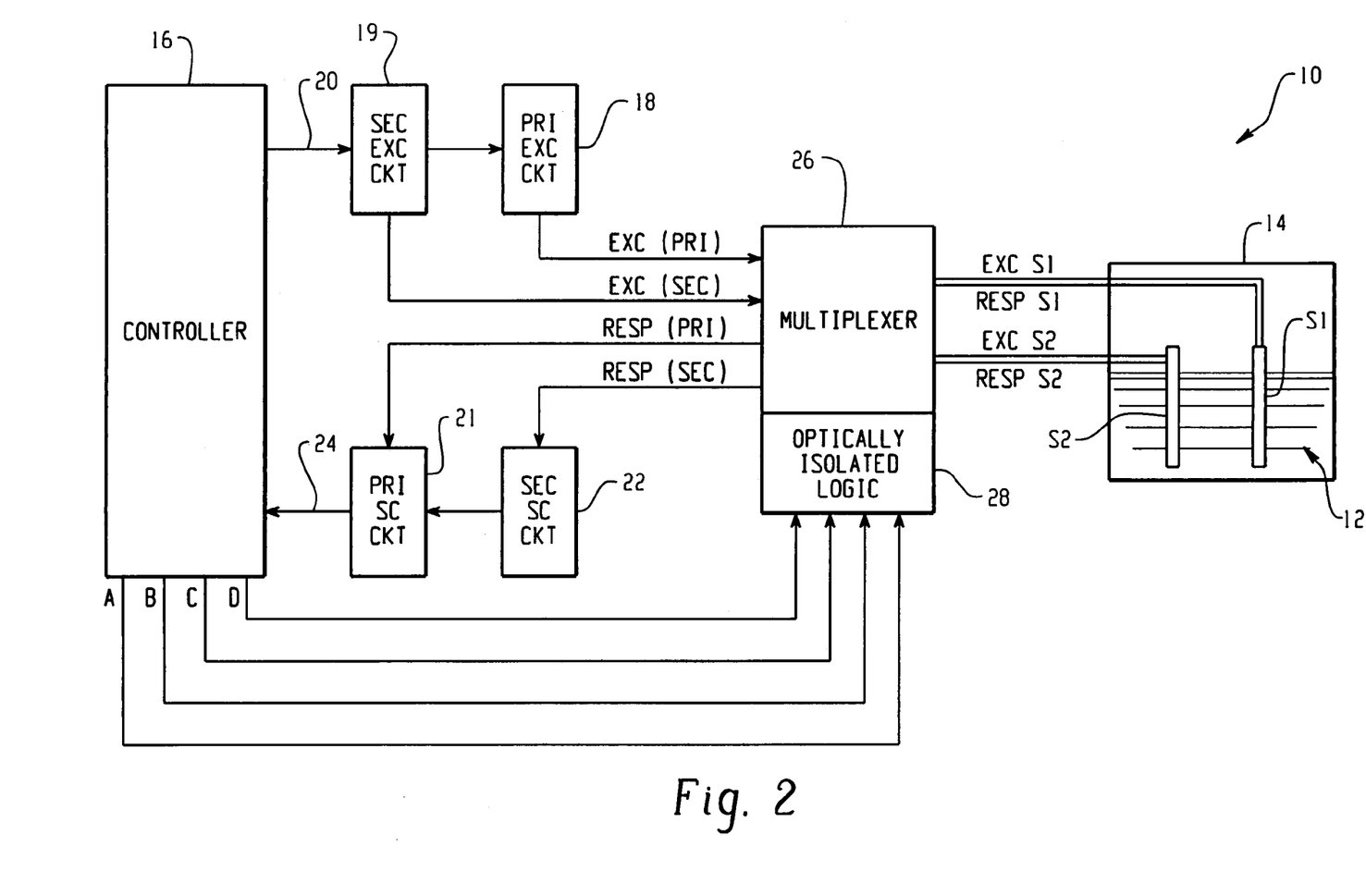
FIG. 2 is a block diagram illustration of an intrinsically safe application of a multiplexing system in accordance with another aspect of the present invention.

FIG. 2 is a block diagram illustration of an intrinsically safe application of the multiplexing system in accordance with another aspect of the present invention. In FIG. 2, a fuel measurement system 10 is operative to measure the quantity of fuel 12 in a fuel tank 14 utilizing a plurality of capacitive type fuel level sensors S1 and S2 disposed within the tank 14. A controller 16 which may be a programmed digital computer, for example, is coupled to a primary exciter circuit 18 and a separate and independent secondary or back-up exciter circuit 19 over signal lines 20 and coupled to a primary signal conditioning circuit 21 and a separate and independent secondary or back-up signal conditioning circuit 22 over signal lines 24. The exciter circuits 18 and 19 and signal conditioning circuits 21 and 22 are common to the plurality of sensors S1 and S2. As directed by the controller 16, the primary exciter circuit 18 is operative to generate a primary excitation signal EXC (PRI) and independent thereof, the secondary exciter circuit 19 is operative to generate a secondary or back-up excitation signal EXC (SEC), both excitation signals provided to a multiplexer circuit 26 over separate and independent signal lines. Likewise, the primary signal conditioning circuit 21 is operative to receive a primary response signal RESP (PRI), and independent thereof, the secondary signal conditioning circuit 22 is operative to receive a secondary or back-up response signal RESP (SEC) over separate and independent lines from the multiplexer circuit 26. All of the circuits 18-22 are designed to afford intrinsically safe signaling to and from the sensors S1 and S2 for the present embodiment.

To achieve certain multiplexing and switch-over functionality, the multiplexer circuit 26 is included with optically isolated logic circuits 28. The output of the multiplexer 26 provides one set of excitation and response signals to each sensor S1 and S2. The multiplexer 26 may be governed by control signals A-D from the controller 16 (or, in the alternative, from pushbutton switches, not shown) to select one of the set of primary excitation and response signal combinations to excite and read one of the capacitive sensors S1 and S2 as will become more evident from the description found herein below. While the embodiment of FIG. 2 is representative of an intrinsically safe application, it is understood that present invention may be applied to other applications and other sensor types without deviating from the broad principles thereof.

Figure 3:
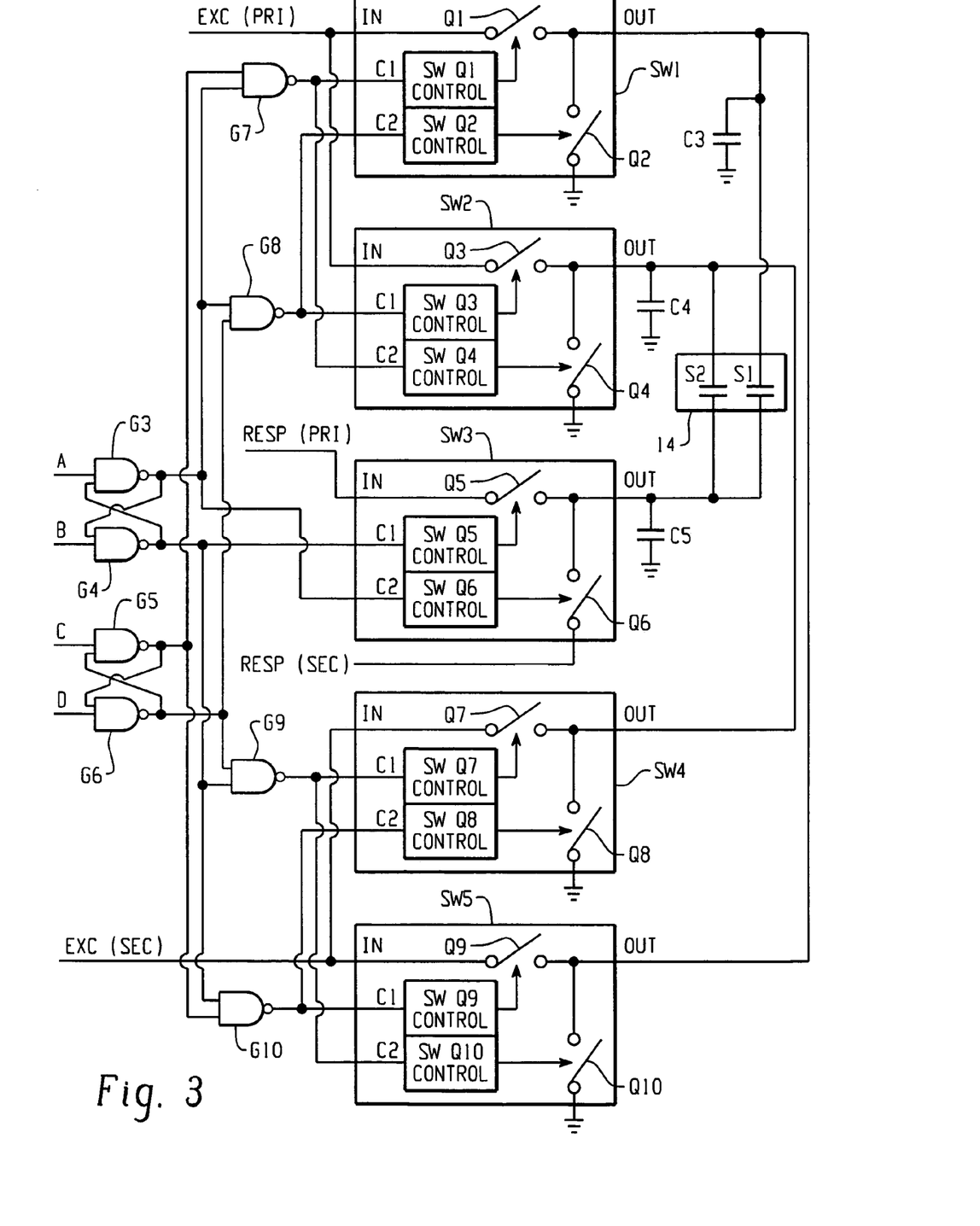
FIG. 3 is a block diagram schematic of an exemplary multiplexer circuit suitable for use in the embodiment of FIG. 2.

More specifically, a block diagram circuit schematic of an exemplary multiplexer circuit suitable for embodying the multiplexer 26 is shown in FIG. 3. The embodiment of FIG. 3 includes a plurality of multiplexer switches SW1-SW5, each of the same design as described in connection with the embodiment of FIG. 1. For example, in switch SW1, switches Q1 and Q2 may include the same dual series connected MOSFET switch design, the SW Q1 control block may include the gate G1 with the control signal C1 connected to the inputs thereof and the optical isolator OP1 with the output voltage thereof applied to the gate to source junctions of the MOSFETs of Q1, and the SW Q2 control block may include the gate G2 with the control signal C2 connected to the inputs thereof and the optical isolator OP2 with the output voltage thereof applied to the gate to source junctions of the MOSFETs of Q2. Switches SW2-SW5 may be of the same design as SW1.

In the embodiment of FIG. 3, EXE (PRI) is an intrinsically safe excitation signal from the primary excitation circuit 18 (see FIG. 2) while RESP (PRI) is the intrinsically safe sensor response signal which is provided to the primary signal conditioning circuit 21. The signals EXE (PRI) and RESP (PRI) in combination make up a primary channel. The EXE (SEC) and RESP (SEC) signals are the same as the aforementioned primary signals, except are associated with a completely independent set of electronics 19 and 22 as shown in FIG. 2, and in combination make up a redundant or backup channel. As noted above in FIG. 2, the representative multiplexer circuit 26 is controlled by logic signals A-D which may be generated by controller 16 or, in the alternative, manual pushbuttons (not shown). Other controls are equally applicable.

In the present embodiment, logic signals A, B, C, and D are coupled to one input of NAND gates G3, G4, G5, and G6, respectively. Gates G3 and G4 are configured as one set-reset (S-R) flip-flop circuit and gates G5 and G6 are configured as another S-R flip flop circuit. The output of gate G5 is coupled to an input of NAND gates G7 and G10, the output of gate G6 is coupled to an input of NAND gates G8 and G9, the output of gate G3 is coupled to another input of gates G7 and G8 and to the control input C2 of switch SW3, and the output of gate G4 is coupled to another input of gates G9 and G10 and to the control input C1 of switch SW3. In addition, the output of gate G7 is coupled to the control inputs C1 of switch SW1 and C2 of switch SW2, the output of gate G8 is coupled to the control inputs C2 of SW1 and C1 of SW2, the output of gate G9 is coupled to the control inputs C1 of SW4 and C2 of SW5, and the output of G10 is coupled to the control inputs C2 of SW4 and C1 of SW5.

In this embodiment, the logic gates G3-G10 and the switch control SW Q1-Q10 make up the optically isolated logic 28 for the multiplexer 26 which are powered from a power source which may be around five volts, for example, and a digital ground. Accordingly, the MOSFET combinations Q1-Q10 of switches SW1-SW5 and their respective photocell drivers are isolated from and floating with respect to the power source and ground of the aforementioned logic circuits. As pointed out above, the maximum current supplied by a photocell is around 50 microamps.

Still referring to FIG. 3, the input sides of Q1 and Q3 are commonly coupled to EXE (PRI), the output side of Q1 is coupled to the excitation lead of S1, and the output side of Q3 is coupled to the excitation lead of S2. Similarly, the input sides of Q7 and Q9 are commonly coupled to EXE (SEC), the output side of Q9 is coupled to the excitation lead of SI, and the output side of Q7 is coupled to the excitation lead of S2. Note that C3 and C4 represent the line capacitance of the excitation leads of S1 and S2, respectively. Also, the input sides of Q2, Q4, Q8, and Q10 are all coupled to ground. The input sides of Q5 and Q6 are coupled to RESP (PRI) and RESP (SEC), respectively, and the output of SW3 is coupled to the response lead(s) of S1 and S2. Note that C5 represents the line capacitance of the response leads of S1 and S2.

Figure 4:
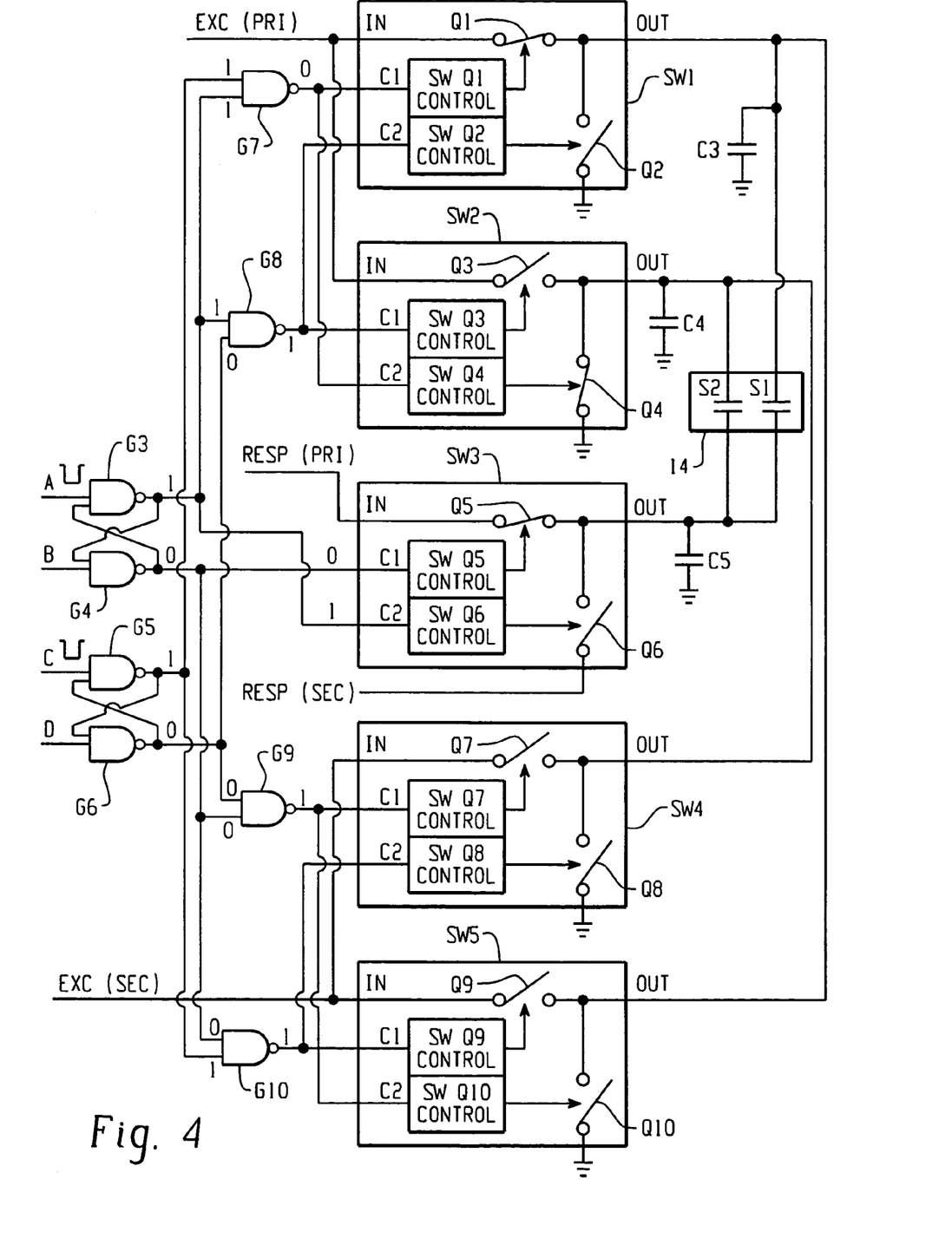
FIGS. 4-7 are block diagrams of the multiplexer circuit suitable for illustrating a plurality of operations thereof.

In the present embodiment, logic signals A and B select between the primary and secondary or back-up channels, and logic signals C and D control to which sensor the excitation/response signals of the selected channel are coupled. More specifically, as shown in FIG. 4, a pulse at logic signal A will select the primary channel and a pulse at logic signal C will select sensor SI. Referring to FIG. 4, when logic signal A is pulsed low, gate G3 is set high represented by the notation "1" and gate G4 is set low represented by the notation "0". With gates G3 and G4 high and low respectively, all of the switches Q7-Q10 of the back-up channel are open circuited and C1 and C2 of SW3 are low and high respectively rendering Q5 closed connecting the response lead of S1 and S2 to the primary circuit 21 (see FIG. 2) and Q6 open circuited. When logic signal C is pulsed low, gate G5 is set high and gate G6 is set low. In this state, the inputs to gate G7 are both high rendering a low signal at its output and C1 of SW1 and C2 of SW2. Also, the inputs to G8 are high and low rendering a high at its output and C2 of SW1 and C1 of SW2. A low C1 and high C2 of SW1 controls Q1 closed connecting EXE (PRI) to the excitation lead of S1 and Q2 open circuited. Likewise, a high C1 and low C2 of SW2 controls Q4 closed connecting the excitation lead of S2 to ground and Q3 open circuited.

Figure 5:
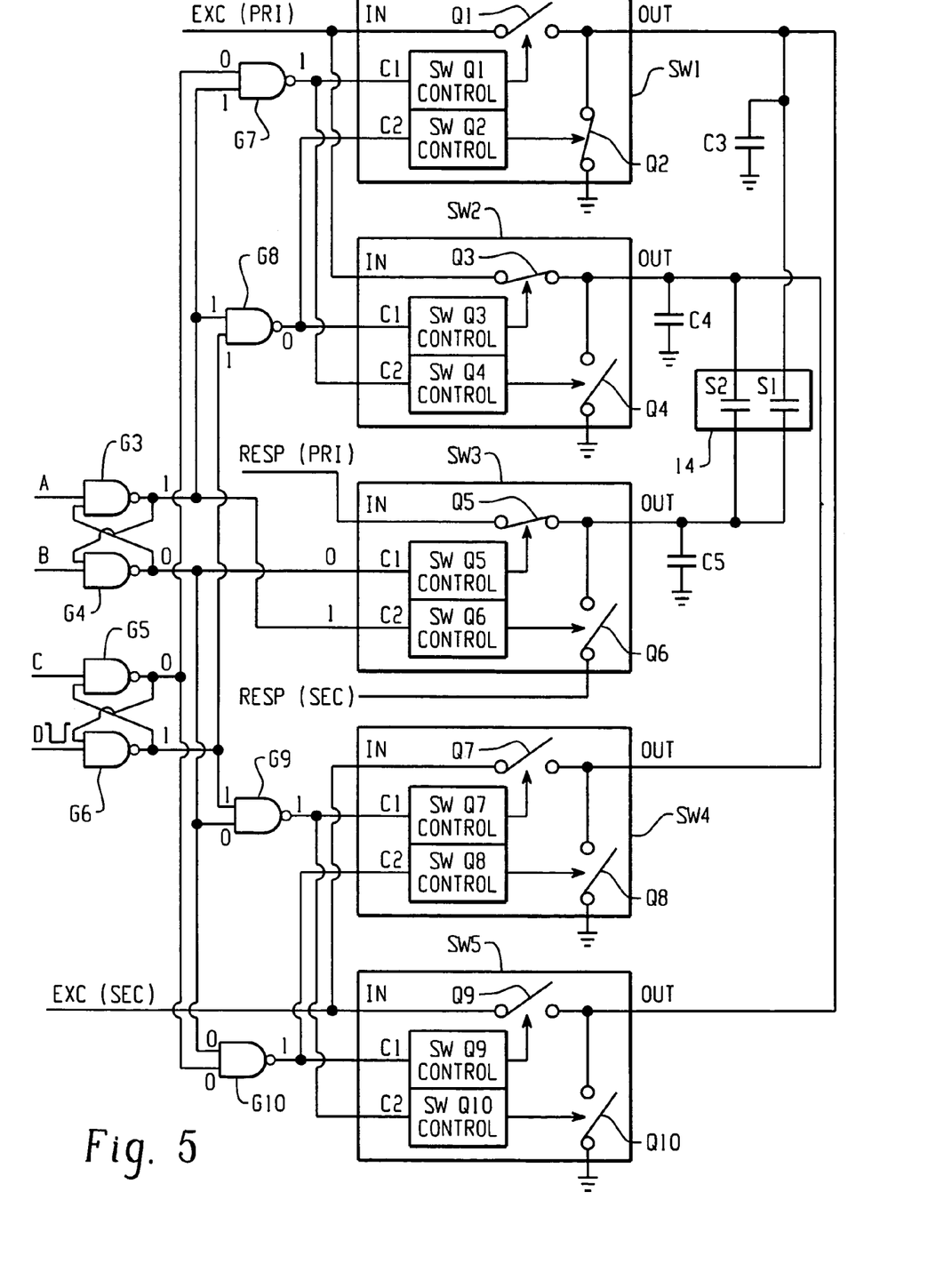

With the primary channel selected, a pulse on signal line D will set the output of gates G6 and G5 high and low respectively as shown in FIG. 5. Referring to FIG. 5, the states of the outputs of G5 and G6 will not alter the open circuited states of Q7-Q10. However, with G6 high and G5 low, the outputs of gates G8 and G7 are rendered low and high respectively, which causes a low signal to be applied to C1 of SW2 and C2 of SW1 and a high signal to be applied to C1 of SW1 and C2 of SW2. In this state, Q3 is closed connecting EXE (PRI) to the excitation lead of S2, Q4 is open circuited, Q2 is closed connecting the excitation lead of S1 to ground, and Q1 is open circuited. Note that the state of SW3 is unchanged maintaining the connection of the response leads of S1 and S2 to the primary channel.

Figure 6:
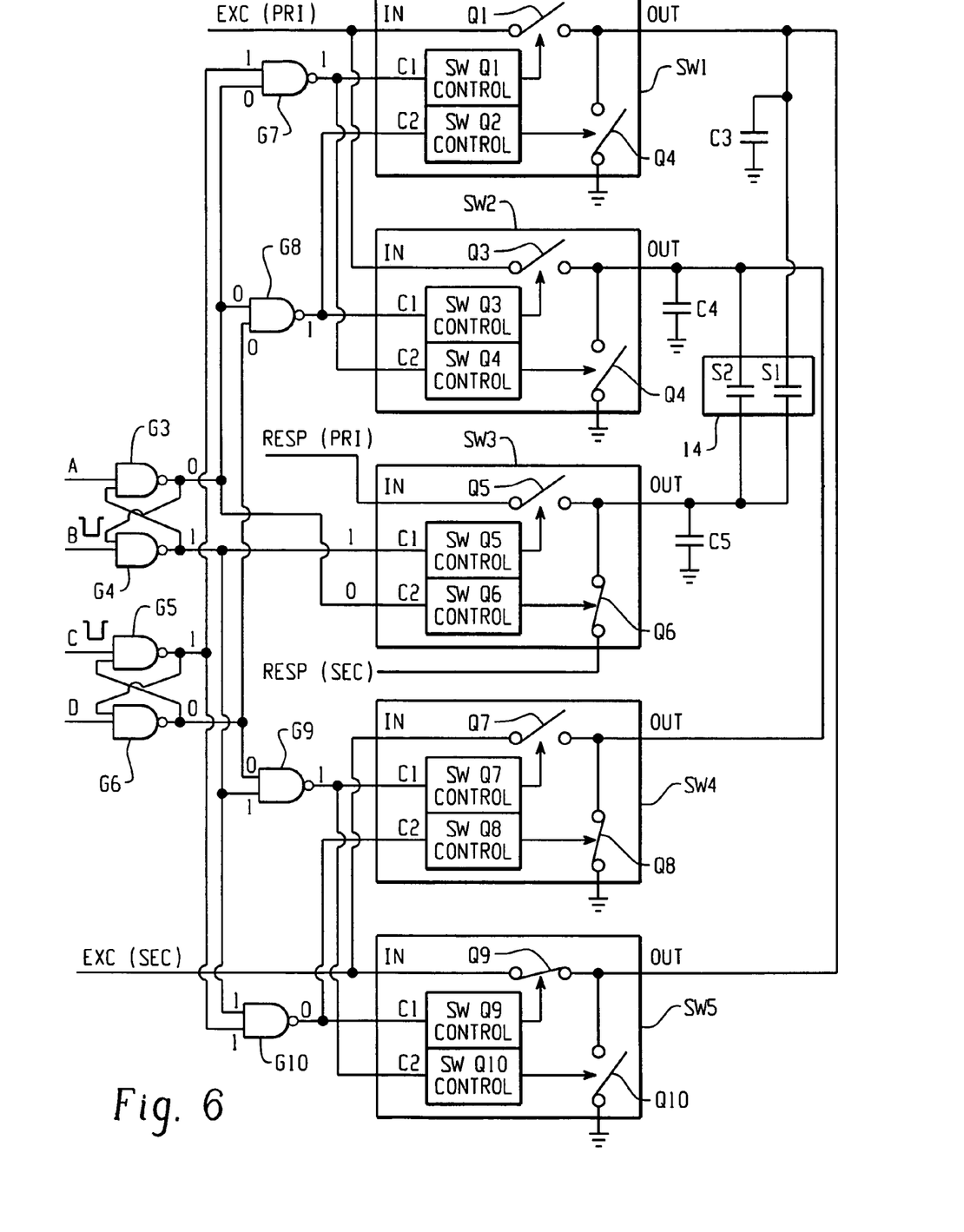

As shown in FIG. 6, pulsing the B logic signal will select the secondary channel and pulsing the C logic signal will connect the excitation/response signals to the sensor S1. More specifically, pulsing the B logic signal will set G4 high and G3 low rendering C1 and C2 of SW3, high and low, respectively, causing Q6 to be closed connecting the response leads to the secondary channel and Q5 to be open circuited. Pulsing the B signal will also render the outputs of gates G7 and G8 high causing Q1-Q4 to be open circuited. Moreover, pulsing the C logic signal will cause the outputs of gates G9 and G10 to be high and low respectively. In this state, Q9 is rendered closed connecting EXE (SEC) to the excitation lead of S1, Q7 and Q10 are rendered open circuited, and Q8 is rendered closed connecting the excitation lead of S2 to ground.

Figure 7:
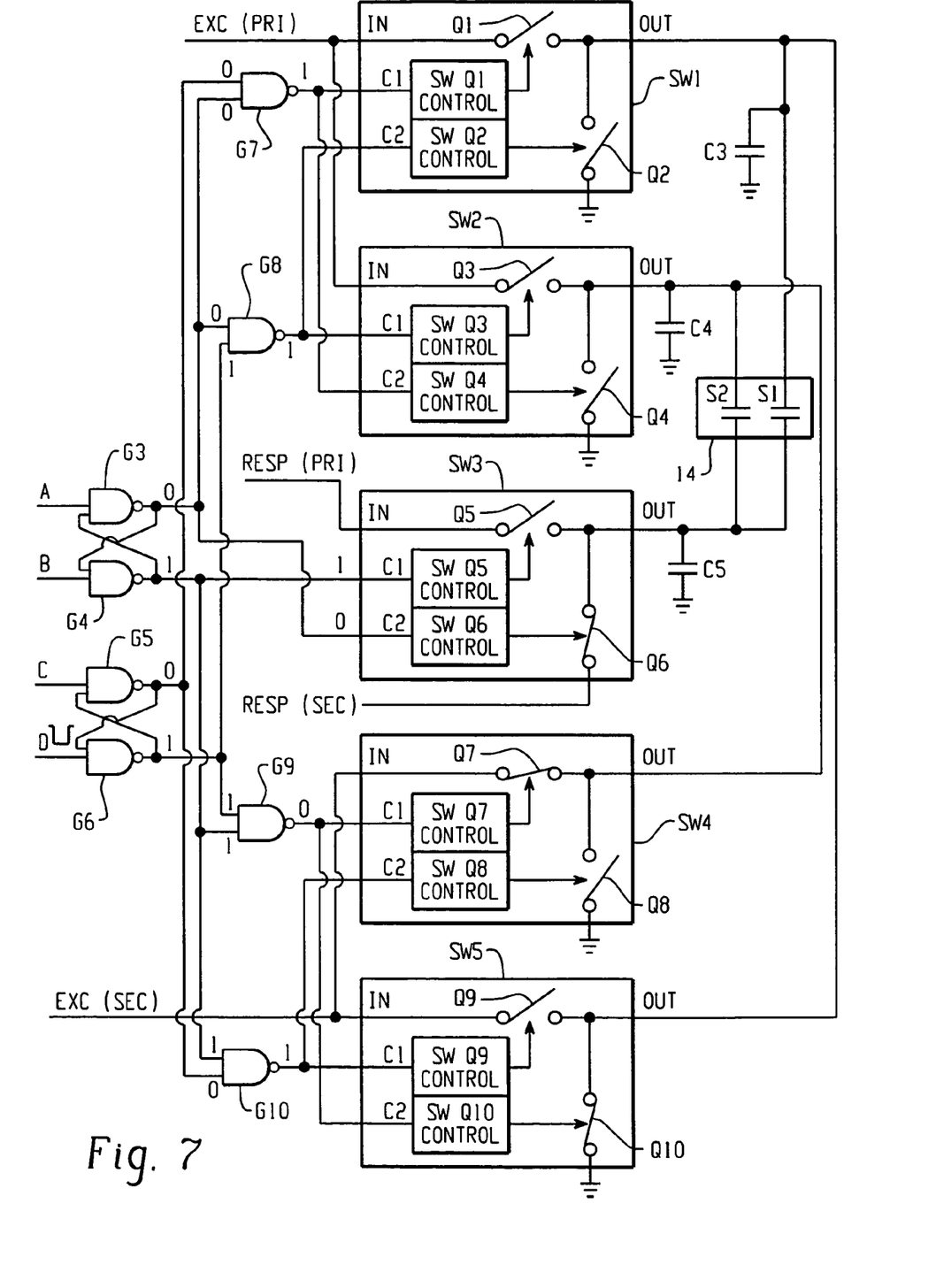

By pulsing logic signal D while the secondary channel is selected will connect the signals of the secondary channel to sensor S2 as shown in FIG. 7. Referring to FIG. 7, pulsing D sets G6 high and G5 low which renders the outputs of G9 and G10 to low and high respectively. Note, however, that the states of Q1-Q6 remain unchanged. With G9 low, Q7 and Q10 are closed connecting EXE (SEC) to the excitation lead of S2 and the excitation lead of S1 to ground, and with G10 high, Q8 and Q9 are rendered open circuited. In this manner, logic signals A and B can select between a primary and back-up or secondary channel of excitation and response signals, thus in the event of a failure or malfunction in one channel, the other channel may be selected. Also demonstrated by the foregoing description is the selection of one of the plurality of sensors for connection to the selected set of excitation and response signals by the logic signals C and D.

The optically isolated logic and switch design of the present embodiment preserves the intrinsically safe nature of the excitation and response signals with a minimal of additional circuitry. A failure in any multiplexer switch of the multiplexer system resulting in a direct connection into the sensor lines which penetrate the explosive vapor containment will not compromise the intrinsically safe design since the control of each switch is performed by an array of photocells of an optical isolator which isolates the switch from and renders the switch floating with respect to the power source of the control logic thereof. The photovoltaic output of the isolators provide sufficient voltage to control the "on" and "off" states of the associated switches, but generate only approximately fifty microamps of current.

In addition, measurement errors caused by in series switch resistance of conventional multiplexer switches and line or stray capacitance as noted above are substantially reduced to within acceptable limits by the present embodiment. For example, the "on" resistance of a multiplexer switch of the present design is under 0.1 ohms and may be further reduced with judicious selection of the MOSFETs. Also, the present multiplexer design does not suffer from the problem in which series switch "on" resistance can interfere with the stability design of the drive amplifier of the excitation signal since the series "on" resistance of each multiplexer switch is commensurate with the resistance of the excitation line itself, thus having a negligible effect on the reactive load being driven by the amplifier.

While the present invention has been described herein above in connection with one or more embodiments, it is understood that such embodiments were presented by way of example with no intention of limiting the invention in any way. Accordingly, the present invention should not be limited by any of the described embodiments, but rather construed in breadth and broad scope in accordance with the recitation of the claims appended hereto.

What is claimed is:

1. A multiplexer switch comprising:
   at least one field effect transistor having a current channel connected in series with a signal line that penetrates a tank containing a potentially explosive environment;
   an isolation circuit; and
   a drive circuit coupled to said at least one field effect transistor through said isolation circuit for operating said current channel thereof, said isolation circuit electrically isolating said drive circuit from said at least one field effect transistor to limit energy coupled to said signal line through said at least one field effect transistor to below levels that could initiate an ignition of the potentially explosive environment of the tank.

2. The switch of claim 1 wherein the at least one field effect transistor comprises a source junction and a drain junction connected in series with the signal line; and wherein the output of the isolation circuit is coupled across a gate junction and the source junction of the at least one field effect transistor to permit operation of the current channel thereof by the drive circuit.

3. The switch of claim 2 wherein the isolation circuit comprises an optical isolator circuit.

4. The switch of claim 3 wherein the optical isolator circuit comprises at least one light emitting diode coupled to the drive circuit and a light detecting circuit for applying a voltage across the gate and the source junctions of the at least one field effect transistor to permit operation of the current channel thereof in response to light received from the light emitting diode.

5. The switch of claim 1 wherein the at least one field effect transistor comprises a series connected plurality of metal oxide semiconductor field effect transistors effecting low conducting resistance.

6. The switch of claim 1 including:
a second at least one field effect transistor having a current channel connected to the signal line downstream of the at least one field effect transistor and at a point before the signal line penetrates the tank;
a second isolation circuit; and
a second drive circuit coupled to said second at least one field effect transistor through said second isolation circuit for operating said current channel thereof, said second isolation circuit electrically isolating said second drive circuit from said second at least one field effect transistor to limit energy coupled to said signal line through said second at least one field effect transistor to below levels that could initiate an ignition of the potentially explosive environment of the tank.

7. The switch of claim 6 wherein the at least one field effect transistor couples an intrinsically safe circuit to a sensor in the tank through the signal line; and wherein the second at least one field effect transistor couples the signal line to a common voltage potential.

8. The switch of claim 7 including a logic circuit for controlling the respective drive circuits of the at least one field effect transistor and the second at least one field effect transistor in a complementary fashion.

9. The switch of claim 6 wherein the at least one field effect transistor couples a first intrinsically safe circuit to a sensor in the tank through the signal line; and wherein the second at least one field effect transistor couples a second intrinsically safe circuit to the sensor through the signal line.

10. The switch of claim 9 including a logic circuit for controlling the respective drive circuits of the at least one field effect transistor and the second at least one field effect transistor in a complementary fashion.

11. A multiplexing system for a plurality of sensors disposed in a tank containing a potentially explosive environment and excited from a common excitation circuit outside of said tank through a corresponding plurality of signal lines that penetrate said tank, said system comprising:
a multiplexer switch for each sensor, each multiplexer switch disposed outside of said tank in series with the corresponding signal line between said common excitation circuit and said corresponding sensor in the tank, each multiplexer switch comprising:
at least one field effect transistor having a current channel connected in series with said corresponding signal line;
an isolation circuit; and
a drive circuit coupled to said at least one field effect transistor through said isolation circuit for operating said current channel thereof, said isolation circuit electrically isolating said drive circuit from said at least one field effect transistor to limit energy coupled to said corresponding signal line through said at least one field effect transistor to below levels that could initiate an ignition of the potentially explosive environment of the tank.

12. The system of claim 11 including a second multiplexer switch for each sensor, each second multiplexer switch disposed outside of said tank and coupled between the corresponding signal line at a point before the signal line penetrates the tank and a common voltage potential, each second multiplexer switch comprising:
a second at least one field effect transistor having a current channel connected between the signal line downstream of the at least one field effect transistor and the common voltage potential;
a second isolation circuit; and
a second drive circuit coupled to said second at least one field effect transistor through said second isolation circuit for operating said current channel thereof, said second isolation circuit electrically isolating said second drive circuit from said second at least one field effect transistor to limit energy coupled to said signal line through said second at least one field effect transistor to below levels that could initiate an ignition of the potentially explosive environment of the tank.

13. The system of claim 12 including a logic circuit for controlling the respective drive circuits of the at least one field effect transistor and the second at least one field effect transistor in a complementary fashion.

14. The system of claim 12 including a third multiplexer switch disposed outside of said tank in series with a second signal line coupling a primary response circuit to the plurality of sensors in the tank, each third multiplexer switch comprising:
a third at least one field effect transistor having a current channel connected in series with said second signal line;
a third isolation circuit; and
a third drive circuit coupled to said third at least one field effect transistor through said third isolation circuit for operating said current channel thereof, said third isolation circuit electrically isolating said third drive circuit from said third at least one field effect transistor to limit energy coupled to said second signal line through said third at least one field effect transistor to below levels that could initiate an ignition of the potentially explosive environment of the tank.

15. The system of claim 14 including a fourth multiplexer switch disposed outside of said tank in series with a third signal line coupling a secondary response circuit to the plurality of sensors in the tank, each fourth multiplexer switch comprising:
a fourth at least one field effect transistor having a current channel connected in series with said third signal line;
a fourth isolation circuit; and
a fourth drive circuit coupled to said fourth at least one field effect transistor through said fourth isolation circuit for operating said current channel thereof, said fourth isolation circuit electrically isolating said fourth drive circuit from said fourth at least one field effect transistor to limit energy coupled to said third signal line through said fourth at least one field effect transistor to below levels that could initiate an ignition of the potentially explosive environment of the tank.

16. The system of claim 15 including a logic circuit for controlling the respective drive circuits of the third at least one field effect transistor and the fourth at least one field effect transistor in a complementary fashion.

17. The system of claim 15 including a fifth multiplexer switch for each sensor, each fifth multiplexer switch disposed outside of said tank in series with a corresponding fourth signal line coupled between a secondary common excitation circuit and the corresponding sensor in the tank, each fifth multiplexer switch comprising:
a fifth at least one field effect transistor having a current channel connected in series with said corresponding fourth signal line;
an fifth isolation circuit; and
a fifth drive circuit coupled to said fifth at least one field effect transistor through said fifth isolation circuit for operating said current channel thereof, said fifth isolation circuit electrically isolating said fifth drive circuit from said fifth at least one field effect transistor to limit energy coupled to said corresponding fourth signal line through said fifth at least one field effect transistor to below levels that could initiate an ignition of the potentially explosive environment of the tank.

18. The system of claim 17 including a sixth multiplexer switch for each sensor, each sixth multiplexer switch disposed outside of said tank and coupled between the corresponding fourth signal line at a point before the signal line penetrates the tank and the common voltage potential, each sixth multiplexer switch comprising:
a sixth at least one field effect transistor having a current channel connected between the corresponding fourth signal line downstream of the sixth at least one field effect transistor and the common voltage potential;
a sixth isolation circuit; and
a sixth drive circuit coupled to said sixth at least one field effect transistor through said sixth isolation circuit for operating said current channel thereof, said sixth isolation circuit electrically isolating said sixth drive circuit from said sixth at least one field effect transistor to limit energy coupled to said corresponding fourth signal line through said sixth at least one field effect transistor to below levels that could initiate an ignition of the potentially explosive environment of the tank.

19. The system of claim 18 including a logic circuit for controlling the respective drive circuits of the fifth at least one field effect transistor and the sixth at least one field effect transistor in a complementary fashion.

20. The system of claim 18 including a logic circuit for enabling operation of the multiplexer switches and second multiplexer switches when the common excitation circuit is in use and for enabling operation of the fifth multiplexer switches and sixth multiplexer switches when the secondary common excitation circuit is in use.

21. The system of claim 18 wherein the at least one field effect transistor of each of the multiplexer switches comprises a source junction and a drain junction connected in series with the corresponding signal line; and wherein each of the isolation circuits includes an output coupled across a gate junction and the source junction of the corresponding at least one field effect transistor to permit operation of the current channel thereof by the corresponding drive circuit.

22. The system of claim 21 wherein each of the isolation circuits comprises an optical isolator circuit.

23. The system of claim 22 wherein each optical isolator circuit comprises at least one light emitting diode coupled to the corresponding drive circuit and a light detecting circuit for applying a voltage across the gate and source junctions of the corresponding at least one field effect transistor to permit operation of the current channel thereof in response to light received from the light emitting diode.

24. The system of claim 23 wherein each of the multiplexer switches comprises a series connected plurality of metal oxide semiconductor field effect transistors effecting low conducting resistance.

25. The system of claim 18 wherein the tank contains a combustible liquid; and wherein each sensor of the plurality is operative in response to an excitation signal to generate a response signal representative of a parameter measurement of the combustible liquid.

26. The system of claim 18 wherein the tank comprises an aircraft fuel tank containing aircraft fuel; and wherein each sensor of the plurality is operative in response to an excitation signal to generate a response signal representative of the level of the aircraft fuel in the tank.

27. The system of claim 26 wherein each sensor comprises a capacitive fuel level measurement sensor.

28. The system of claim 18 wherein the common excitation circuit, secondary excitation circuit, primary response circuit and secondary response circuit are all intrinsically safe circuits.

29. A method of multiplexing an excitation signal from a common excitation circuit to a plurality of sensors disposed in a tank containing a potentially explosive environment, said method comprising the steps of:
disposing a multiplexer switch in series with each signal line coupling a corresponding sensor of said plurality to said common excitation circuit outside of said tank;
isolating each multiplexer switch from a corresponding drive circuit to limit energy coupled to said corresponding signal line through said corresponding multiplexer switch to below levels that could initiate an ignition of the potentially explosive environment; and
controlling the drive circuits to multiplex the excitation signal from the excitation circuit to selected sensors of said plurality through the corresponding multiplexer switches.

30. The method of claim 29 including the steps of:
coupling a second multiplexer switch between each signal line, at a point downstream of each multiplexer switch and before the signal line penetrates the tank, and a common potential;
isolating each second multiplexer switch from a corresponding second drive circuit to limit energy coupled to said corresponding signal line through said corresponding second multiplexer switch to below levels that could initiate an ignition of the potentially explosive environment; and
controlling the second drive circuits to couple the signal lines corresponding to the unselected sensors of said plurality to the common potential through the corresponding second multiplexer switches.

31. The method of claim 29 including the steps of:
disposing a second multiplexer switch is series with each second signal line coupling a corresponding sensor of said plurality to a secondary common excitation circuit outside of said tank;

isolating each second multiplexer switch from a corresponding second drive circuit to limit energy coupled to said corresponding second signal line through said corresponding second multiplexer switch to below levels that could initiate an ignition of the potentially explosive environment;

enabling the second drive circuits when the secondary common excitation circuit is in use; and controlling the second drive circuits, when enabled, to multiplex the excitation signal from the secondary excitation circuit to selected sensors of said plurality through the corresponding second multiplexer switches.

32. The method of claim 29 including the steps of:

disposing a second multiplexer switch is series with a second signal line coupling the sensors of the plurality to a primary response circuit outside of said tank;

isolating said second multiplexer switch from a second drive circuit to limit energy coupled to said second signal line through said second multiplexer switch to below levels that could initiate an ignition of the potentially explosive environment; and controlling the second drive circuit to couple a response signal from the selected sensor of the plurality to said primary response circuit through said second multiplexer switch.

33. The method of claim 32 including the steps of:

disposing a third multiplexer switch is series with a third signal line coupling the sensors of the plurality to a secondary response circuit outside of said tank;

isolating said third multiplexer switch from a third drive circuit to limit energy coupled to said third signal line through said third multiplexer switch to below levels that could initiate an ignition of the potentially explosive environment;

enabling the third drive circuit when said secondary response circuit is in use; and controlling the third drive circuit, when enabled, to couple a response signal from the selected sensor of the plurality to said secondary response circuit through said third multiplexer switch.

\* \* \* \* \*